(12) United States Patent
Cheng et al.

(10) Patent No.: US 10,763,118 B2
(45) Date of Patent: Sep. 1, 2020

(54) CYCLIC SELECTIVE DEPOSITION FOR TIGHT PITCH PATTERNING

(71) Applicant: International Business Machines Corporation, Armonk, NY (US)

(72) Inventors: Kangguo Cheng, Schenectady, NY (US); Zhenxing Bi, Niskayuna, NY (US); Juntao Li, Cohoes, NY (US); Dexin Kong, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/032,750

(22) Filed: Jul. 11, 2018

(65) Prior Publication Data

US 2020/0020540 A1 Jan. 16, 2020

(51) Int. Cl.
*H01L 21/00* (2006.01)
*H01L 21/308* (2006.01)
*H01L 29/66* (2006.01)
*H01L 21/033* (2006.01)
*H01L 21/8238* (2006.01)
*H01L 29/78* (2006.01)

(52) U.S. Cl.
CPC ...... *H01L 21/3088* (2013.01); *H01L 21/0337* (2013.01); *H01L 21/0338* (2013.01); *H01L 21/3081* (2013.01); *H01L 21/3086* (2013.01); *H01L 21/823821* (2013.01); *H01L 21/823864* (2013.01); *H01L 29/66545* (2013.01); *H01L 29/66795* (2013.01); *H01L 29/785* (2013.01)

(58) Field of Classification Search
CPC .................. H01L 21/0337; H01L 21/3088
See application file for complete search history.

(56) References Cited

U.S. PATENT DOCUMENTS

| 5,838,045 | A | * | 11/1998 | Muller | H01L 21/0338 257/301 |
| 7,423,304 | B2 | | 9/2008 | Cleeves et al. | |
| 7,560,388 | B2 | | 7/2009 | Kim et al. | |
| 7,919,413 | B2 | * | 4/2011 | Chen | H01L 21/0338 257/E21.249 |
| 8,039,326 | B2 | * | 10/2011 | Knorr | H01L 21/76232 257/E21.63 |

(Continued)

OTHER PUBLICATIONS

Herregods et al., "Vapour phase self-assembled monolayers for ALD blocking on 300 mm wafer scale," Joint EuroCVD 21—Baltic ALD 15, At Linköping, Sweden (Jun. 2017) (2 pages).

(Continued)

*Primary Examiner* — Nicholas J Tobergte
(74) *Attorney, Agent, or Firm* — Vazken Alexanian; Michael J. Chang, LLC (57) ABSTRACT

Techniques for tight pitch patterning of fins using a cyclic selective deposition process are provided. In one aspect, a method of patterning fins in a wafer includes: forming at least one mandrel on the wafer; forming alternating layers of a first dielectric and a second dielectric alongside the at least one mandrel; removing the at least one mandrel; removing either the first dielectric or the second dielectric; and patterning the fins in the wafer using whichever of the first dielectric or the second dielectric that remains as fin hardmasks. A finFET device and method for forming a finFET device are also provided.

17 Claims, 9 Drawing Sheets

(56) References Cited

U.S. PATENT DOCUMENTS

| | | | |
|---|---|---|---|
| 8,431,329 B2* | 4/2013 | Bae | G03F 7/0035 |
| | | | 430/312 |
| 8,940,650 B2 | 1/2015 | Cao et al. | |
| 9,048,194 B2 | 6/2015 | Zhu | |
| 9,269,627 B1* | 2/2016 | Cheng | H01L 21/02532 |
| 9,540,729 B1 | 1/2017 | Okura et al. | |
| 9,728,421 B2 | 8/2017 | Brink et al. | |
| 9,773,676 B2 | 9/2017 | Chang et al. | |
| 10,020,196 B2* | 7/2018 | deVilliers | H01L 21/3081 |
| 10,304,744 B1* | 5/2019 | Joseph | H01L 21/823487 |
| 2003/0207584 A1 | 11/2003 | Sivakumar et al. | |
| 2006/0240361 A1* | 10/2006 | Lee | H01L 21/0337 |
| | | | 430/313 |
| 2007/0099431 A1* | 5/2007 | Li | H01L 21/3081 |
| | | | 438/735 |
| 2011/0269252 A1* | 11/2011 | Sant | H01L 21/3086 |
| | | | 438/9 |
| 2013/0196508 A1* | 8/2013 | LiCausi | H01L 21/823821 |
| | | | 438/696 |
| 2013/0228863 A1* | 9/2013 | Wang | H01L 29/66795 |
| | | | 257/347 |
| 2014/0087563 A1* | 3/2014 | Sant | H01L 21/3086 |
| | | | 438/702 |
| 2014/0110817 A1* | 4/2014 | Bergendahl | H01L 21/3086 |
| | | | 257/506 |
| 2015/0170905 A1 | 6/2015 | Tran et al. | |
| 2016/0093502 A1* | 3/2016 | Cheng | H01L 21/3086 |
| | | | 257/623 |
| 2016/0099178 A1* | 4/2016 | Zhang | H01L 21/02532 |
| | | | 438/478 |
| 2017/0365601 A1 | 12/2017 | Doris et al. | |
| 2018/0053651 A1* | 2/2018 | Leobandung | H01L 21/823431 |
| 2018/0053694 A1* | 2/2018 | Cheng | H01L 21/823475 |
| 2018/0082906 A1 | 3/2018 | Song et al. | |
| 2019/0058087 A1* | 2/2019 | Jacob | H01L 33/24 |
| 2019/0189443 A1* | 6/2019 | Xu | H01L 29/6653 |

OTHER PUBLICATIONS

Lee et al., "Feature-Size Dependence of Etch Rate in Reactive Ion Etching," J. Electrochem. Soc., vol. 138, issue 8, pp. 2439-2445 (Aug. 1991).

* cited by examiner

CYCLIC SELECTIVE DEPOSITION FOR TIGHT PITCH PATTERNING

FIELD OF THE INVENTION

The present invention relates to fin field effect transistor (finFET) devices, and more particularly, to techniques for tight pitch patterning of fins, e.g., for finFET devices, using a cyclic selective deposition process.

BACKGROUND OF THE INVENTION

Forming patterns with a tight pitch (e.g., below a 30 nanometer (nm) pitch) has become increasingly desired for fabricating advanced semiconductor devices. For instance, a 7 nm fin field effect transistor (finFET) has a fin pitch of 27 nm.

Such an aggressive fin pitch is achieved either by self-aligned quadruple pattering (SAQP) whereby a sidewall image transfer (SIT) technique is performed twice, or extreme-ultraviolet (EUV) lithography in conjunction with self-aligned double pattering (SADP). Both approaches are, however, extremely complex and costly.

Therefore, there is a need for tight pitch patterning with a reduced complexity and cost.

SUMMARY OF THE INVENTION

The present invention provides techniques for tight pitch patterning of fins using a cyclic selective deposition process. In one aspect of the invention, a method of patterning fins in a wafer is provided. The method includes: forming at least one mandrel on the wafer; forming alternating layers of a first dielectric and a second dielectric alongside the at least one mandrel; removing the at least one mandrel; removing either the first dielectric or the second dielectric; and patterning the fins in the wafer using whichever of the first dielectric or the second dielectric that remains as fin hardmasks.

In another aspect of the invention, a method of forming a fin field-effect transistor (finFET) device is provided. The method includes: forming at least one mandrel on a wafer; forming alternating layers of a first dielectric and a second dielectric alongside the at least one mandrel; removing the at least one mandrel; removing either the first dielectric or the second dielectric; patterning fins in the wafer using whichever of the first dielectric or the second dielectric that remains as fin hardmasks; forming gates over the fins; and forming source and drains on opposite sides of the gates, offset from the gates by gate spacers.

In yet another aspect of the invention, a finFET device is provided. The finFET device includes: fins patterned in a wafer including at least a first group and a second group of the fins, wherein a spacing S1 between the fins in the first group and the fins in the second group is independent from a spacing S2 between the first group and the second group; gates disposed over the fins; and source and drain regions on opposite sides of the gates, offset from the gates by gate spacers.

A more complete understanding of the present invention, as well as further features and advantages of the present invention, will be obtained by reference to the following detailed description and drawings.

DETAILED DESCRIPTION OF PREFERRED EMBODIMENTS

Provided herein are techniques for forming tight pitch patterns (e.g., fins for fin field-effect transistor (finFET) devices by using a cyclic selective deposition technique. Advantageously, the techniques described herein enable a fin pitch below 20 nanometers (nm) without the need of expensive extreme-ultraviolet (EUV) lithography or multiple patterning.

As will be described in detail below, alternating deposition cycles will be used to deposit periodic oxide and nitride layers over a sacrificial mandrel(s). By 'sacrificial' it is meant that the mandrels will be removed later in the process. The deposition over the mandrels is selective in the sense that, at each cycle, the next layer (i.e., oxide or nitride) is deposited only on the previous layer. Thus, to use a simple example, if an oxide layer is the outermost layer over the mandrels, then in the next cycle a nitride layer will be selectively deposited only onto the previous oxide layer. The next deposition cycle involves selective deposition of another oxide layer on the nitride, and so on. The deposition cycles can be repeated as many times as is needed for fin patterning. Namely, following placement of the periodic, alternating oxide and nitride layers, one type (oxide or nitride) is removed selective to the other. For instance, according to an exemplary embodiment, the oxide layers are removed selective to the nitride layers. The remaining (e.g., nitride) layers are then used as hardmasks for fin patterning (i.e., "fin hardmasks").

Figure 1:
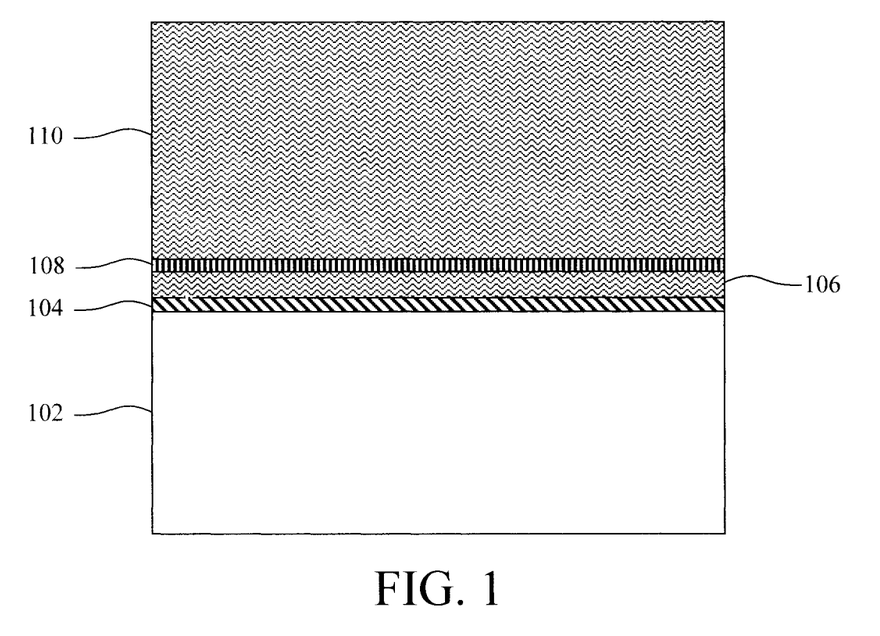
FIG. 1 is a cross-sectional diagram illustrating a pad layer having been formed on a wafer, a first etch stop layer having been formed on the pad layer, a second etch stop layer having been formed on the first etch stop layer, and a mandrel layer having been formed on the second etch stop layer according to an embodiment of the present invention.

An exemplary methodology for forming a finFET device that employs the present cyclic selective deposition technique is now described by way of reference to FIGS. 1-18. As shown in FIG. 1, the process begins with a substrate wafer 102. According to an exemplary embodiment, wafer 102 is a bulk semiconductor wafer, such as a bulk silicon (Si), bulk germanium (Ge), bulk silicon germanium (SiGe) and/or bulk III-V semiconductor wafer. Alternatively, wafer 102 can be a semiconductor-on-insulator (SOI) wafer. A SOI wafer includes a SOI layer separated from an underlying substrate by a buried insulator. When the buried insulator is an oxide it is referred to herein as a buried oxide or BOX. The SOI layer can include any suitable semiconductor, such as Si, Ge, SiGe, and/or a III-V semiconductor.

A pad layer 104 is then formed on the wafer 102. Suitable materials for the pad layer 104 include, but are not limited to, oxide materials such as silicon dioxide ($SiO_2$) and/or silicon oxycarbide (SiOC). By way of example only, the pad layer 104 can be deposited onto the substrate 102 using a process such as atomic layer deposition (ALD), chemical vapor deposition (CVD) or physical vapor deposition (PVD). According to an exemplary embodiment, the pad layer 104 is formed having a thickness of from about 2 nanometers (nm) to about 5 nm and ranges therebetween.

A first etch stop layer 106 is formed on the pad layer 104. Suitable materials for the first etch stop layer 106 include, but are not limited to, amorphous silicon (a-Si). By way of example only, the first etch stop layer 106 can be deposited onto the pad layer 104 using a process such as ALD, CVD or PVD. According to an exemplary embodiment, the first etch stop layer 106 is formed having a thickness of from about 3 nm to about 7 nm and ranges therebetween.

A second etch stop layer 108 is formed on the first etch stop layer 106. Suitable materials for the second etch stop layer 108 include, but are not limited to, oxide materials such as $SiO_2$ and/or SiOC. By way of example only, the second etch stop layer 108 can be deposited onto the first etch stop layer 106 using a process such as ALD, CVD or PVD. According to an exemplary embodiment, the second etch stop layer 108 is formed having a thickness of from about 1 nm to about 5 nm and ranges therebetween.

A mandrel layer 110 is formed on the second etch stop layer 108. Suitable materials for the mandrel layer 110 include, but are not limited to, amorphous silicon (a-Si). By way of example only, the mandrel layer 110 can be deposited onto the second etch stop layer 108 using a process such as ALD, CVD or PVD. According to an exemplary embodiment, the mandrel layer 110 is formed having a thickness of from about 40 nm to about 50 nm and ranges therebetween.

Figure 2:
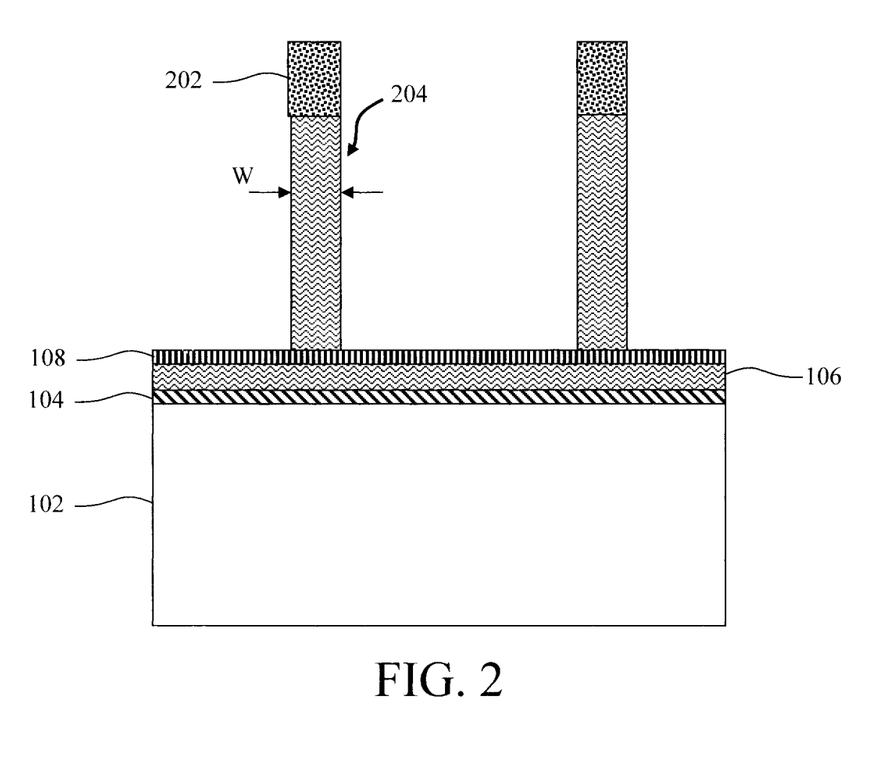
FIG. 2 is a cross-sectional diagram illustrating a patterned hardmask having been formed on the mandrel layer, and the mandrel layer having been patterned into at least one individual mandrels according to an embodiment of the present invention.

The mandrel layer 110 is then patterned into at least one individual mandrels 204. See FIG. 2. To do so, standard lithography and etching techniques are used to pattern a hardmask 202 on the mandrel layer 110 marking the footprint and location of the mandrels 204. Suitable hardmask materials include, but are not limited to, nitride hardmask materials such as silicon nitride (SiN). A directional (i.e., anisotropic) etching process such as reactive ion etching (RIE) can be employed for the mandrel etch. As shown in FIG. 2, the etch of mandrel layer 110 stops on second etch stop layer 108.

Since the pitch of the mandrels 204 is large (e.g., about 200 nm), there is no need to use a costly process such as EUV for patterning. According to an exemplary embodiment, the mandrels 204 are formed having a width W of from about 20 nm to about 30 nm and ranges therebetween.

Figure 3:
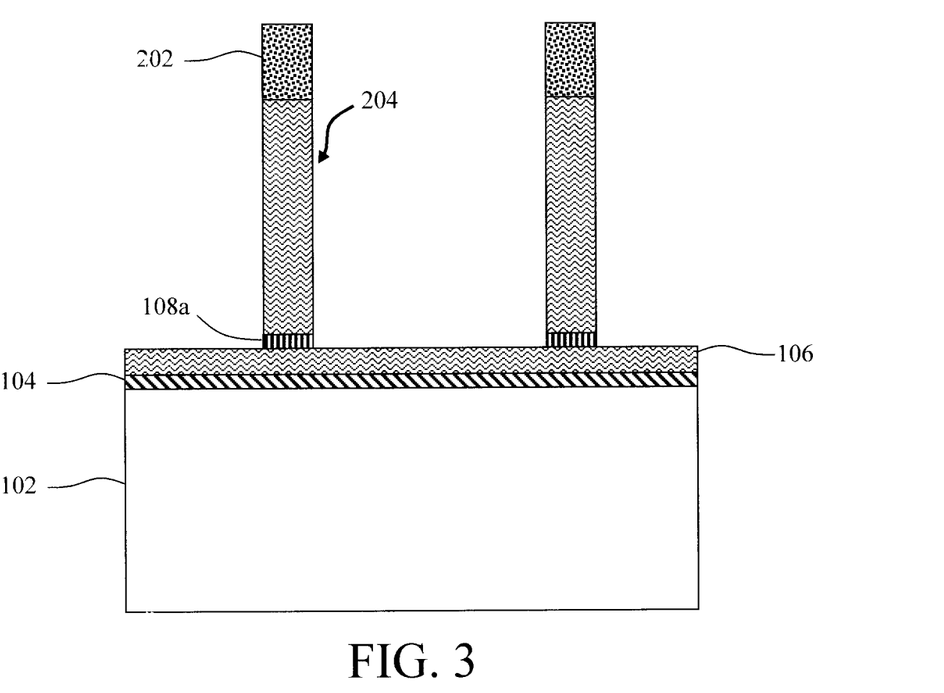
FIG. 3 is a cross-sectional diagram illustrating the mandrels having been extended into the etch stop layer according to an embodiment of the present invention.

A second etch step is then used to extend the mandrels 204 into the second etch stop layer 108. See FIG. 3. Again, a directional (i.e., anisotropic) etching process such as RIE can be employed. As shown in FIG. 3, the second etch stop layer 108 stops on first etch stop layer 106. The patterned portions of the second etch stop layer 108 are given the reference numeral 108a. Patterning of the mandrels 204 is now complete.

Figure 4:
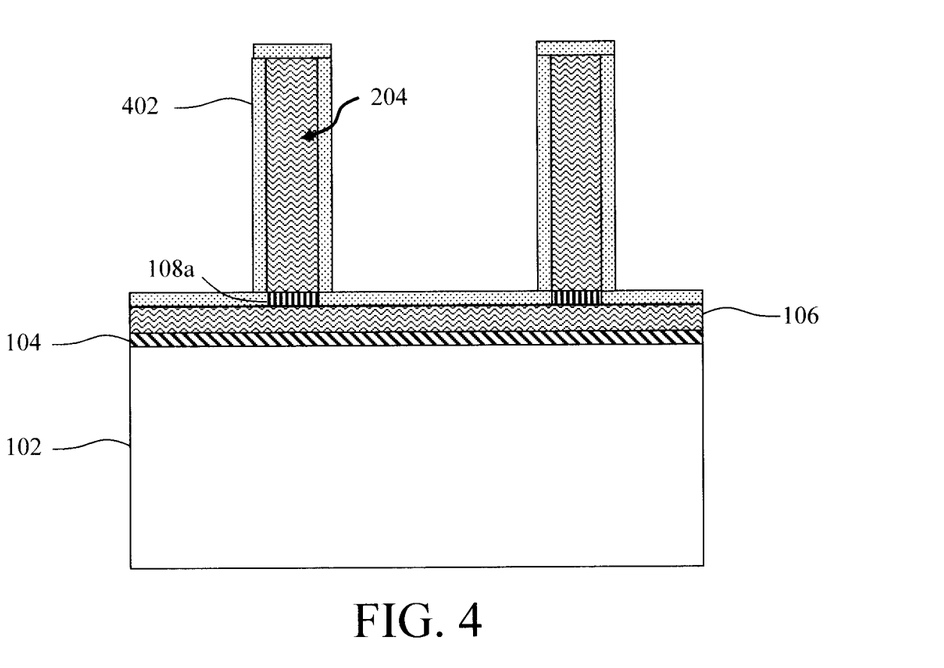
FIG. 4 is a cross-sectional diagram illustrating the patterned hardmask having been removed, and spacers having been formed along the sidewalls of the mandrels according to an embodiment of the present invention.

As shown in FIG. 4, the patterned hardmask 202 is removed, and spacers 402 are formed along the sidewalls of the mandrels 204. Suitable materials for the spacers 402 include, but are not limited to, oxide materials such as S102 and/or SiOC. By way of example only, the spacers 402 can be deposited onto the first etch stop layer 106 using a process such as ALD, CVD or PVD. According to an exemplary embodiment, the spacers 402 are formed having a thickness of from about 1 nm to about 5 nm and ranges therebetween.

Figure 5:
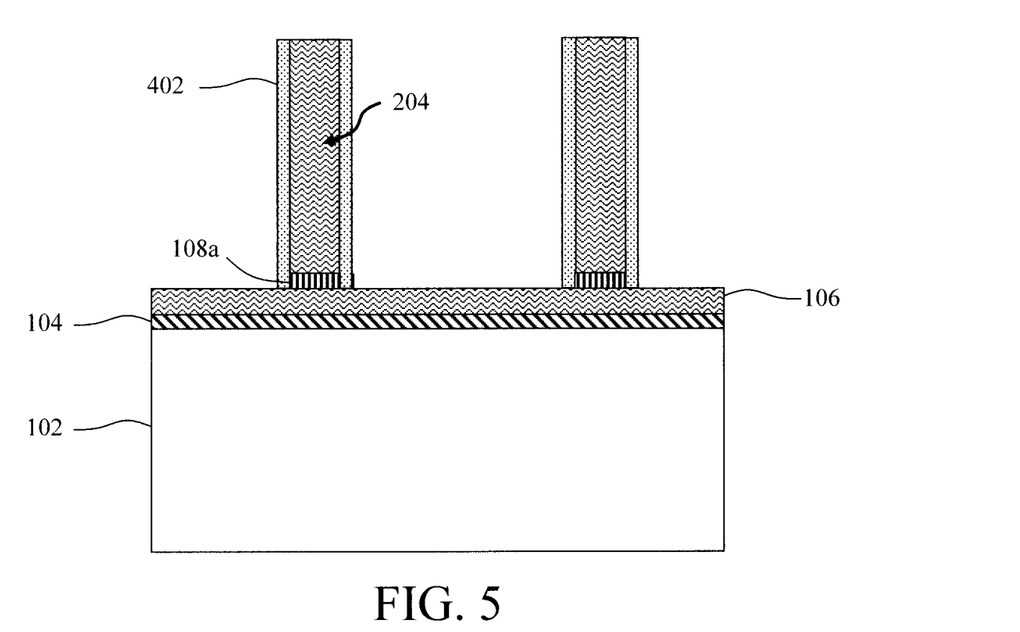
FIG. 5 is a cross-sectional diagram illustrating the spacers having been removed from exposed horizontal surfaces including the surface of the mandrel layer and at the tops of the etch stop layer according to an embodiment of the present invention.

The goal is to have the spacers 402 present along only the sidewalls of the mandrels 204. By placing the spacers 402 along the sidewalls of the mandrels 204, the deposition cycles of periodic first/second dielectric (nitride/oxide) layers next performed will selectively place these layers sequentially along the sidewalls of the mandrels 204 (as opposed to on the surface of the first etch stop layer 106). Thus, as shown in FIG. 5, a directional etching process (such as RIE) is used to remove the spacers 402 from exposed horizontal surfaces including the surface of the first etch stop layer 106 and at the tops of the mandrels 204.

Figure 6:
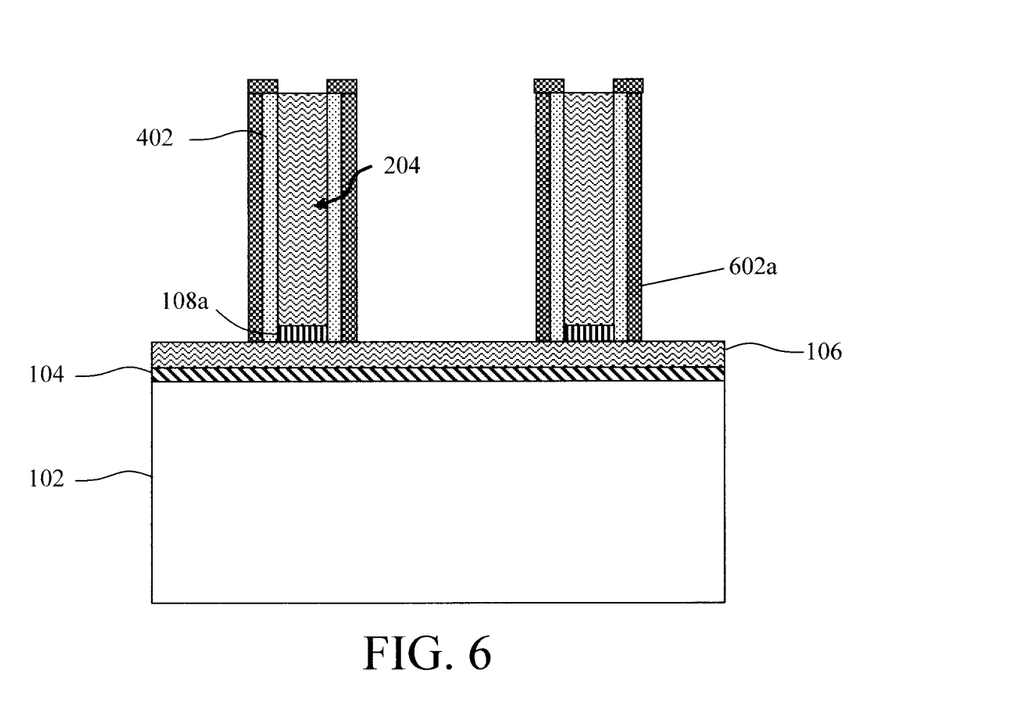
FIG. 6 is a cross-sectional diagram illustrating a first (e.g., nitride) dielectric layer having been deposited onto only the exposed surfaces of spacers according to an embodiment of the present invention.

In the first deposition cycle, a first dielectric layer, i.e., nitride dielectric layer 602a, is formed selectively on the (oxide) spacers 402. See FIG. 6. Namely, as shown in FIG. 6, nitride dielectric layer 602a is deposited onto only the exposed surfaces of spacers 402. For instance, a process such as area-selective ALD can be employed for selective deposition in this manner whereby the nitride dielectric of layer 602a is deposited onto the exposed surfaces of the (oxide) spacers 402 as opposed to the (a-Si) surfaces of first etch stop layer 106. A suitable area-selective ALD process is described, for example, in Herregods et al., "Vapour phase self-assembled monolayers for ALD blocking on 300 mm wafer scale," Joint EuroCVD 21-Baltic ALD 15, At Linkoping, Sweden (June 2017) (2 pages) (hereinafter "Herregods"), the contents of which are incorporated by reference as if fully set forth herein. For instance, Herregods describes an area selective deposition of dielectric on dielectric where Thiol-self-assembly monolayers (SAMs) passivation is used to block film growth during a subsequent ALD step. Suitable nitride dielectric materials include, but are not limited to, SiN and/or silicon oxycarbonitride (SiOCN). As shown in FIG. 6, nitride dielectric layer 602a is formed on the exposed surfaces of the spacers 402, including on a small portion of the exposed spacers 402 at the tops of the mandrels 204 (i.e. producing an inverted 'L' shape).

In the next cycle, a second dielectric layer, i.e., oxide dielectric layer 702a, is formed selectively on the nitride dielectric layer 602a. See FIG. 7. Again, a process such as area-selective ALD can be employed for selective deposition in this manner whereby the oxide dielectric of layer 702a is deposited onto the exposed surfaces of the nitride dielectric layer 602a as opposed to the (a-Si) surfaces of first etch stop layer 106. A suitable area-selective ALD process is described, for example, in Herregods. Suitable oxide dielectric materials include, but are not limited to, $SiO_2$ and/or SiOC. The process is then iterated x times to deposit third, fourth, etc. periodic, alternating nitride dielectric layer 602b, c, etc. and oxide dielectric layer 702b,c, etc. See FIG. 7. The value of x will ultimately depend on a desired number of fin hardmasks/fins to be patterned, and the process can be repeated as many times as needed. By way of example only, x is from about 1 nm to about 10 nm and ranges therebetween. Thus, the number of layers 602x and 702x shown formed in FIG. 7 is merely an example.

Advantageously, based on this process, the patterning pitch is determined by the thicknesses of the nitride dielectric layers 602a,b,c, etc. and oxide dielectric layers 702a,b,c, etc., independent of lithography. The term "pitch" as used herein refers to the distance from a given location on one fin hardmask/fin to the same location on the adjacent fin hardmask/fin. According to an exemplary embodiment, each of the nitride dielectric layers 602a,b,c, etc. and oxide dielectric layers 702a,b,c, etc. are formed having a thickness of from about 5 nm to about 10 nm and ranges therebetween. Thus, to use an illustrative, non-limiting example, with 10 nm nitride/oxide dielectric layers 602/702, a pitch of 20 nm can readily be formed. The excess material from dielectric layers 602/702 deposited on top of the mandrels 204 will be removed later in the process.

Figure 7:
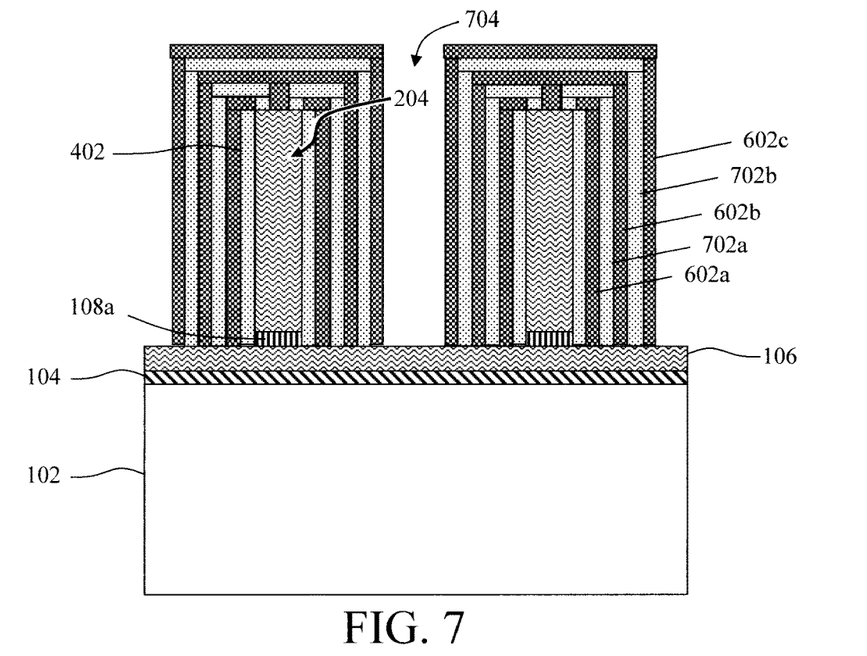
FIG. 7 is a cross-sectional diagram illustrating a second (e.g., oxide) dielectric layer having been formed selectively on the first dielectric layer, and the process iterated x times to deposit third, fourth, etc. periodic, alternating dielectric layers (e.g., oxide/nitride) forming a trench between the dielectric layers alongside adjacent mandrels according to an embodiment of the present invention.
Figure 8:
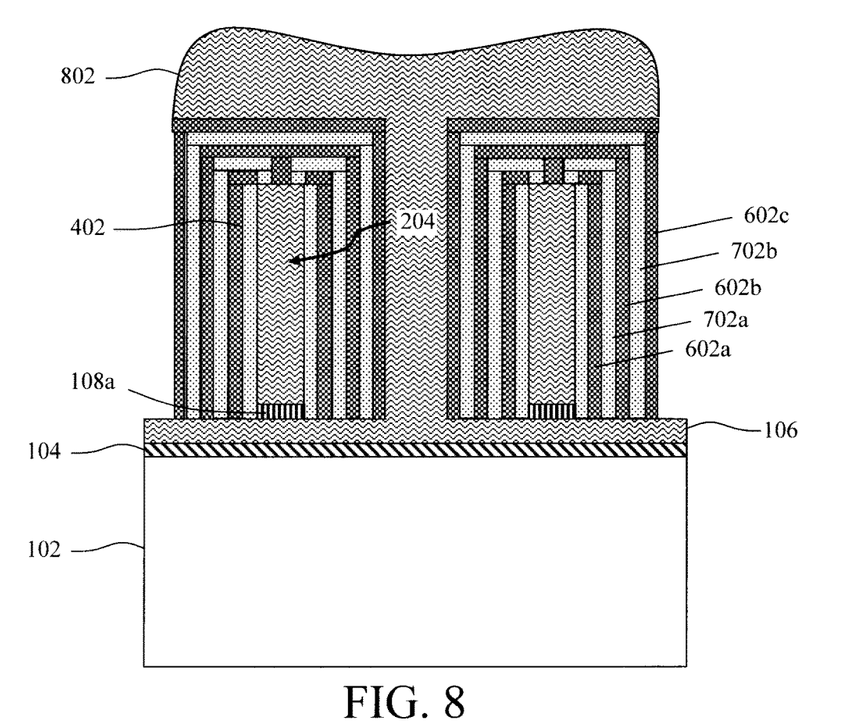
FIG. 8 is a cross-sectional diagram illustrating the trench having been filled with a filler material according to an embodiment of the present invention.

As shown in FIG. 7, following deposition of the dielectric layers 602/702, a trench 704 is present between the dielectric layers 602/702 alongside adjacent mandrels 204. This trench 704 is then filled with a filler material 802. See FIG. 8. Preferably, the same material is used for the filler material 802 as for the mandrels 204/first etch stop layer 106. For instance, suitable filler materials include, but are not limited to a-Si. Use of the same filler material as the mandrels 204/first etch stop layer 106 will facilitate the formation of deep trenches for inter-well isolation later on in the process by enabling all three layers to be removed via a common (e.g., a-Si) selective etching process.

As provided above, the excess material from dielectric layers 602/702 deposited on top of the mandrels 204 is now removed along with the excess filler material 802 above the mandrels 204. See FIG. 9. According to an exemplary embodiment, these excess materials are removed using a process such as chemical-mechanical polishing (CMP), a non-selective reactive ion etch, or combinations thereof. As a result, the periodic, alternating dielectric layers 602a,b,c, etc./702a,b,c, etc. are formed alongside the mandrels 204 above the wafer 102.

Figure 9:
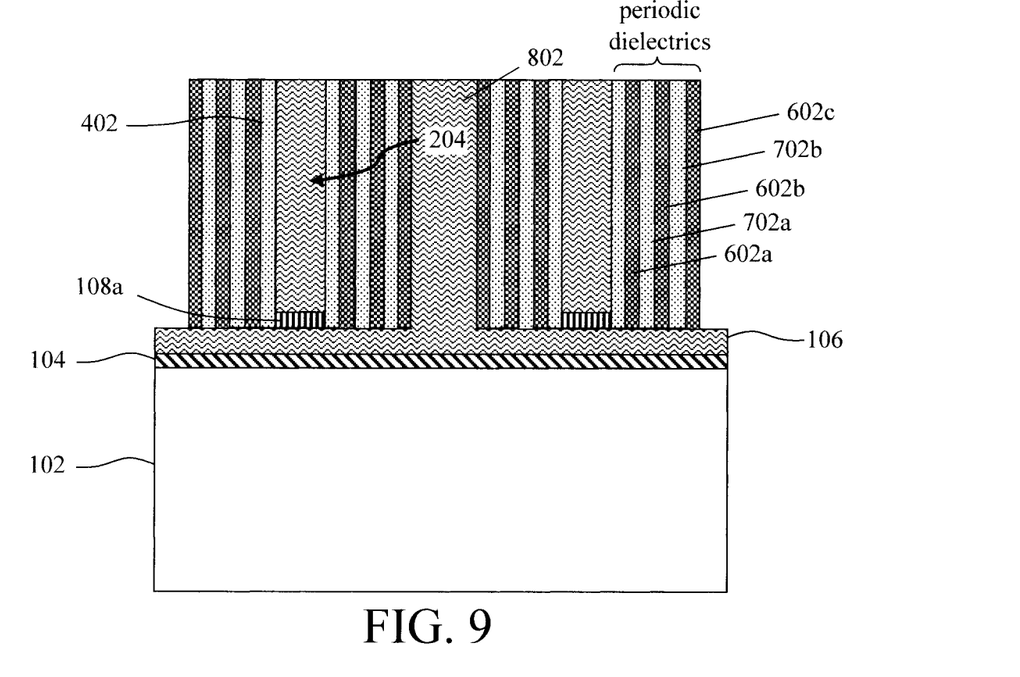
FIG. 9 is a cross-sectional diagram illustrating excess material from the dielectric layers deposited on top of the mandrels having been removed along with excess filler material above the mandrels according to an embodiment of the present invention.
Figure 10:
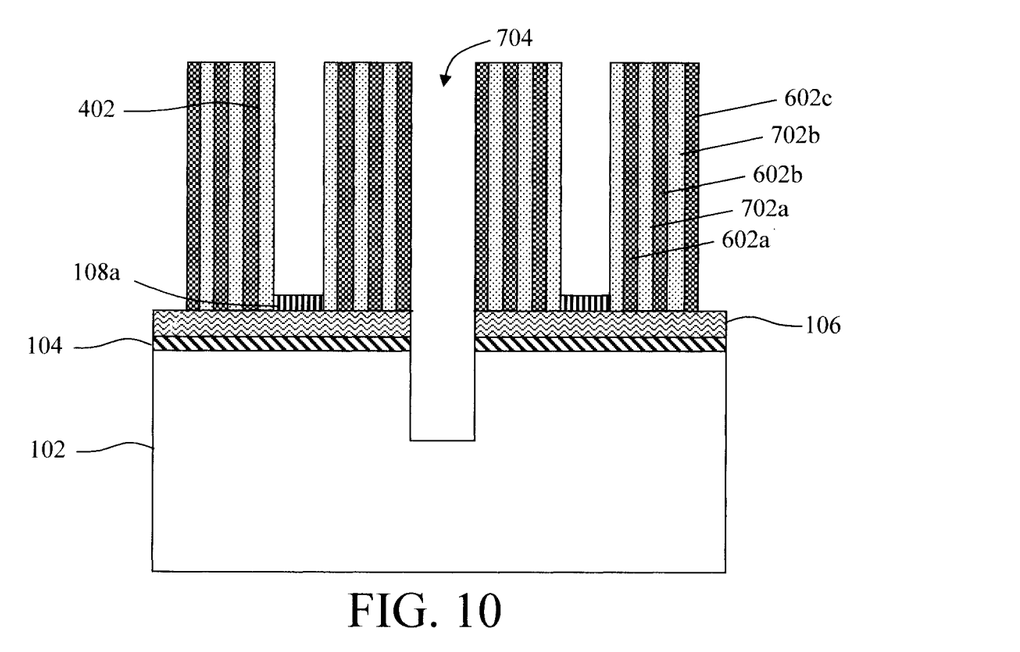
FIG. 10 is a cross-sectional diagram illustrating a series of etch steps having been performed to remove the mandrels/filler material, and to extend the trench through the mandrel layer/pad layer, and partway into the wafer according to an embodiment of the present invention.

Further, as shown in FIG. 9, the tops of the mandrels 204 (as well as filler material 802 in trench 704) are now exposed. This will enable the mandrels 204 and the filler material 802 to be removed to form deep trenches for inter-well isolation. Namely, as shown in FIG. 10, a series of etch steps are next performed to remove the mandrels 204/filler material 802, and to extend the trench 704 through the first etch stop layer 106/pad layer 104, and partway into the wafer 102.

By way of example only, assuming the mandrels 204/first etch stop layer 106/filler material 802 include a common material (e.g., a-Si) a first etch step will clear these materials down to the pad layer 104. An a-Si selective RIE, for instance, will leave the nitride/oxide dielectric layers 602/702 intact. One or more additional RIE steps can then be performed to extend trench 704 through the pad layer 104 and into the wafer 102. By way of example only, this deeper trench isolation etch can be performed using a selective RIE or wet chemical etch (e.g., $NH_3OH$ ammonia).

According to an exemplary embodiment, the spacer 402, oxide dielectric layers 702 and remaining portions 108a of the second etch stop layer are then removed. See FIG. 11. By way of example only, a non-directional (i.e., isotropic) etch with buffered hydrofluoric acid (BHF) can be employed at this step to remove the spacer 402 and oxide dielectric layers 702 selective to the nitride dielectric layers 602. The nitride dielectric layers 602 that remain serve as fin hardmasks with a tight pitch (e.g., from about 20 nm to about 28 nm and ranges therebetween) that, as described above, is independent of lithography.

Figure 11:
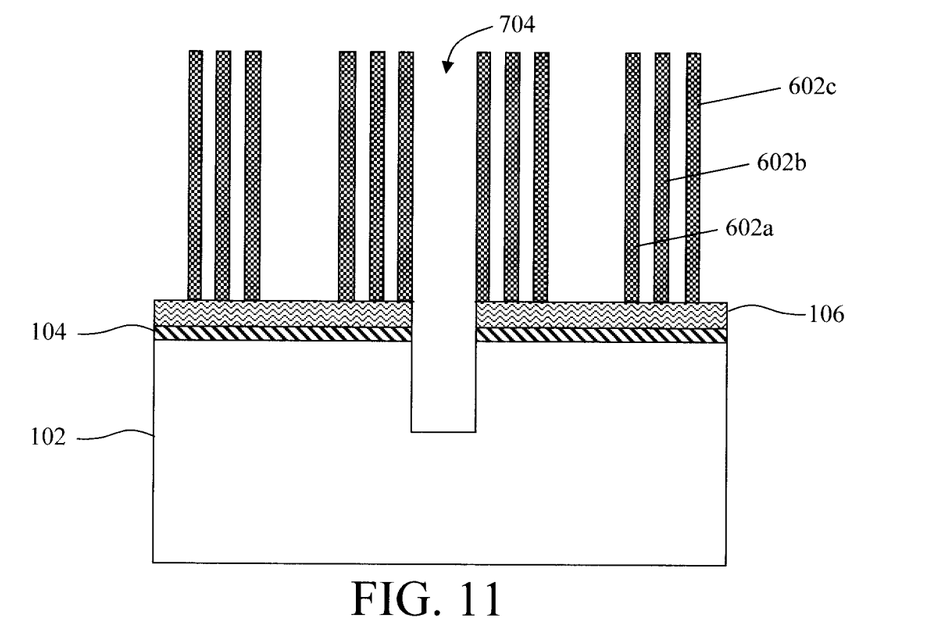
FIG. 11 is a cross-sectional diagram illustrating the spacer, one of the dielectric layers (e.g., oxide) and remaining portions of the etch stop layer having been removed according to an embodiment of the present invention.

It is notable that, while the present example illustrates (selective) removal of the oxide dielectric layers 702 leaving the nitride dielectric layers 602 in place to serve as fin hardmasks, this is only one example. For instance, embodiments are also contemplated herein where the nitride dielectric layers 602 are selectively removed such that the oxide dielectric layers 702 remain in place to serve as fin hardmasks.

The nitride dielectric layers 602 as fin hardmasks are then used to etch fins 1202 in the wafer 102. See FIG. 12. As above, a series of etch steps are performed to pattern the fins in the first etch stop layer 106/pad layer 104/wafer 102 with nitride dielectric layers 602 as the fin hardmasks. A directional (anisotropic) etching process such as RIE can be employed for the fin etch. The patterned portions of the first etch stop layer 106 and the pad layer 104 are given reference numerals 106a and 104a, respectively.

Figure 12:
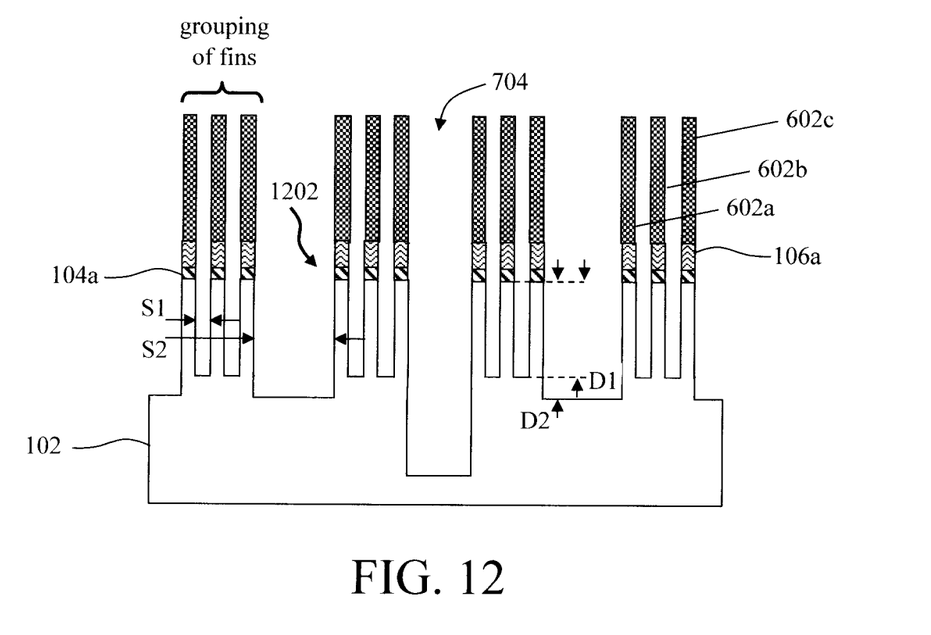
FIG. 12 is a cross-sectional diagram illustrating the remaining dielectric layers (e.g., nitride) having been used as fin hardmasks to etch fins in the wafer according to an embodiment of the present invention.
Figure 13:
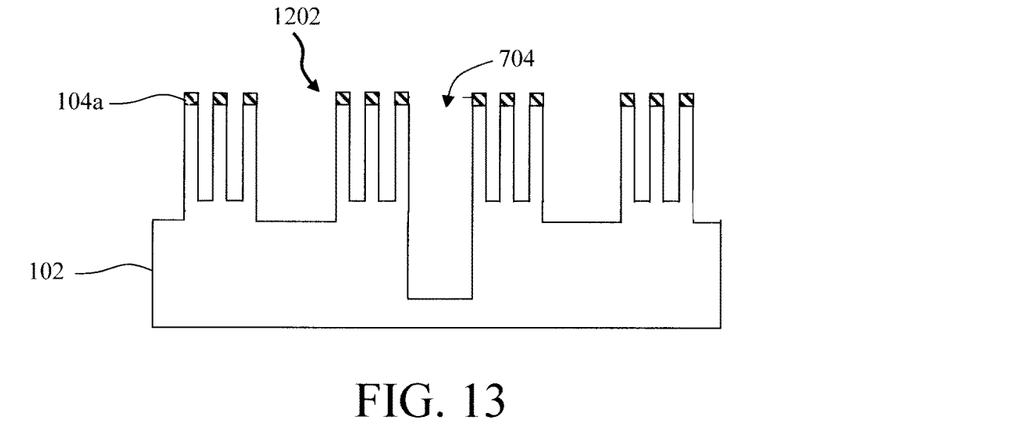
FIG. 13 is a cross-sectional diagram illustrating the remaining fin hardmasks having been removed according to an embodiment of the present invention.

Notably, based on the present process, the fins 1202 are patterned in groups. Within each group, a spacing S1 between the fins 1202 is based on the thickness of the periodic, alternating nitride/oxide dielectric layers 602/702. On the other hand, a spacing S2 between adjacent groups of fins 102 is based on the width W of the mandrels 204. See FIG. 2 (described above). Varying the width W varies the spacing S2 between adjacent groups of fins 102. Decreasing W brings adjacent groups of fins 1202 closer together, while increasing W moves them farther apart. As such, S1 and S2 are independent of one another. For instance, the spacing S2 between adjacent groups of fins 102 can be adjusted (e.g., by varying the mandrel width W) without affecting the spacing S1 in each group, and vice versa. According to an exemplary embodiment, S1 is from about 5 nm to about 50 nm and ranges therebetween, and S2 is from about 10 nm to about 100 nm and ranges therebetween. According to an exemplary embodiment, the pitch of the fins 1202 (which is based on the thicknesses of the dielectric layers 602 and 702—see above) in each group of fins is from about 20 nm to about 30 nm and ranges therebetween.

As shown in FIG. 12, a depth D1 to which the fins 1202 are patterned in each group can differ from a depth D2 between the groups of fins 1202, i.e., D1<D2. This is due to a decrease in etch rate that occurs with a decrease in feature size. See, for example, Lee et al., "Feature-Size Dependence of Etch Rate in Reactive Ion Etching," J. Electrochem. Soc., vol. 138, issue 8, pgs. 2439-2445 (August 1991), the contents of which are incorporated by reference as if fully set forth herein. Thus, during fin patterning, a decreased etch rate within groupings of the fins 1202 results in the shallower etch depth D1.

As shown in FIG. 12, the fin etch also increases a depth of the trench 704 in the wafer 102. As highlighted above, trench 704 provides inter-well isolation. Inter-well isolation refers to the electrical isolation between the finFET devices in adjacent wells. For instance, as will be described in detail below, an N-well and a P-well will be formed in the wafer beneath the fins 1202. Trench 704, which will be filled with an insulator, separates the N-well from the P-well. Further, shallow trenches between groups of fins, also filled with the insulator, will provide intra-well isolation between finFET devices located in the same N-well or P-well.

As also shown in FIG. 12, the fin etch reduces the height of the nitride dielectric layers 602/fin hardmasks. What remains of the nitride dielectric layers 602/fin hardmasks is then removed, as are the patterned portions 106a of the first etch stop layer 106. See FIG. 13. According to an exemplary embodiment, the nitride dielectric layers 602/fin hardmasks are stripped using a wet etch chemistry such as hot phosphoric acid, and the patterned portions 106a of the first etch stop layer 106 are removed using a directional etch such as RIE (stopping on the patterned portions 104a of the pad layer 104.

Figure 14:
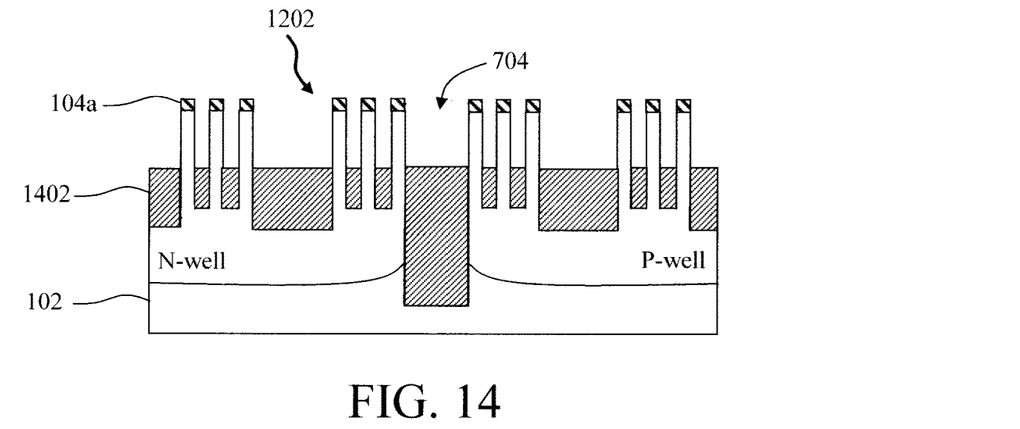
FIG. 14 is a cross-sectional diagram illustrating the trench isolation, and an N-well and a P-well having been formed in the wafer below the fins according to an embodiment of the present invention.

As shown in FIG. 14, an ion implant is then performed to form an N-well and a P-well in the wafer 102 below the fins 1202. Suitable N-well dopants include, but are not limited to, phosphorous (P) and/or arsenic (As). Suitable P-well dopants include, but are not limited to, boron (B). Deep/shallow trench isolation is then formed by depositing an insulator 1402 between the fins 1202. See FIG. 14. Suitable insulators include, but are not limited to, oxide materials such as $SiO_2$. As shown in FIG. 14, the insulator 1402 deposited into trench 704 provides deep trench (inter-well) isolation separating the N-well from the P-well, whereas the insulator 1402 deposited between groups of the fins 1202 provide intra-well isolation between the finFET devices located in the same N-well or P-well.

Gates 1502 and 1504 are then formed over the P-FET fins 1202 (i.e., those fins 1202 present over the N-well) and the N-FET fins 1202 (i.e., those fins 1202 present over the P-well), respectively. See FIG. 15.

Figure 15:
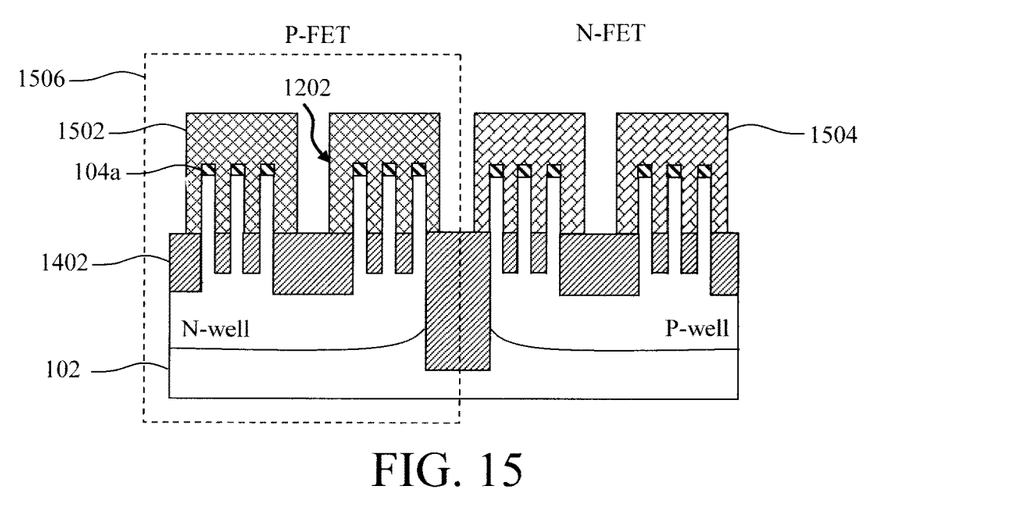
FIG. 15 is a cross-sectional diagram illustrating gates having been formed over the (P-FET and N-FET) fins according to an embodiment of the present invention.

According to an exemplary embodiment, a "gate last" process is employed whereby a sacrificial "dummy" gate is placed over the fin channels and acts as a placeholder for the final device gate, oftentimes a metal gate. Metal gates employ high-κ gate dielectrics that are particularly sensitive to the conditions (such as elevated temperatures) employed during formation of device structures such as the source and drain. Thus, placing a dummy gate enables the source and drain to be formed without consequence to the final gate structure. Afterwards, near the end of the process, the dummy gate is removed and replaced with a 'replacement' final gate. In that case, gates 1502 and 1504 are dummy gates. Dummy gates may be formed by blanket depositing a suitable dummy gate material, and then using standard lithography and etching techniques to pattern the dummy gate material into individual dummy gates. Suitable dummy gate materials include, but are not limited to, poly-silicon and/or amorphous silicon.

Advantageously, the use of dummy gates at this stage in the process prevents elevated temperatures employed during the drive-in anneal from causing any performance degradation. For instance, subjecting high-κ gate dielectrics to high thermal stress can cause these materials to breakdown, thereby degrading device performance.

Alternatively, a gate-first process is employed wherein the gates 1502 and 1504 are final gates of the device. For instance, when low-κ gate dielectrics are employed (see below), there is less of a concern with thermal stability, and the use of dummy gates might be foregone. Suitable final/replacement gate configurations are described in detail below.

To illustrate the remainder of the process used to complete the finFET devices, reference is made to the highlighted grouping 1506 of the fins 1202 in FIG. 15. In this particular illustration, grouping 1506 depicts the P-FET fins 1202. However, this is done merely for ease and clarity of depiction since the same process is performed concurrently in the N-FET fins 1202 in same manner described.

Figure 16:
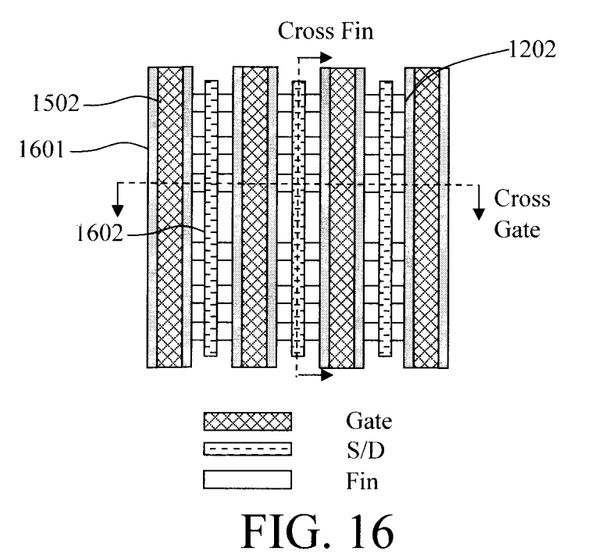
FIG. 16 is a top-down diagram illustrating gate spacers having been formed alongside the gates which offset source and drains that are formed on opposite sides of the gates according to an embodiment of the present invention.

Referring first to a top-down view of the P-FET fins 1202, as shown in FIG. 16, gate spacers 1601 are first formed alongside the gates 1502 and 1504. The gate spacers 1601 offset source and drains 1602 that are then formed on opposite sides of the gates 1502 and 1504. Suitable spacer materials include, but are not limited to, oxide materials such as $SiO_2$ and/or silicon oxycarbide (SiOC) and nitride materials such as silicon nitride (SiN) and/or silicon oxycarbonitride (SiOCN). According to an exemplary embodiment, the source and drains 1602 are formed using an epitaxial growth process whereby the source and drains 1602 are doped in-situ (i.e., during epitaxial growth) or ex-situ (e.g., via ion implantation) with an n-type or p-type dopant(s). Suitable n-type dopants include, but are not limited to, phosphorous (P) and/or arsenic (As), and suitable p-type dopants include, but are not limited to, boron (B). By way of example only, suitable doped epitaxial materials for the P-FET source and drains 1602 include, but are not limited to, phosphorus-doped silicon (Si:P) and suitable doped epitaxial materials for the N-FET source and drains 1602 include, but are not limited to, boron-doped silicon germanium (SiGe:B).

Figure 17:
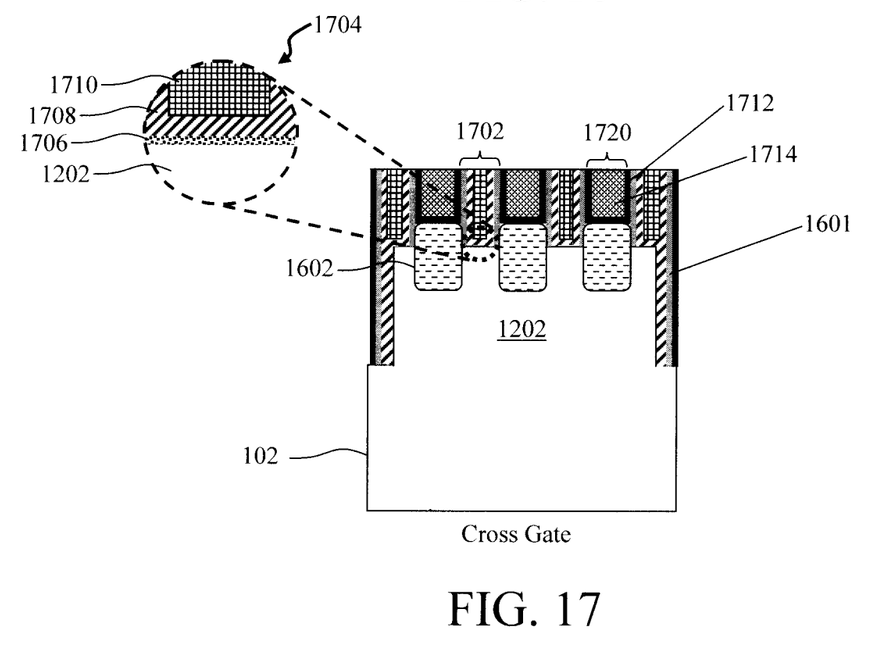
FIG. 17 is a cross-sectional diagram illustrating the gates having been removed and replaced with replacement gates according to an embodiment of the present invention.

In the case of a gate-first process, the N-FET and P-FET devices are complete at this stage. As described above, with a gate-first process gates 1502 and 1504 are the final gates of the device. By contrast, when a gate-last process flow is implemented, steps are needed to remove the dummy gates (i.e., gate 1502 and 1504 are sacrificial dummy gates—see above). The steps to remove and replace the dummy gates are now described by way of reference to FIGS. 17 and 18. In the following figures, reference will be made to cross-sectional cuts through the fin/gate structures. For instance, FIG. 17 provides a 'cross-gate' cross-sectional view taken as a cut through one of the fins 1202 perpendicular to the gates

Figure 18:
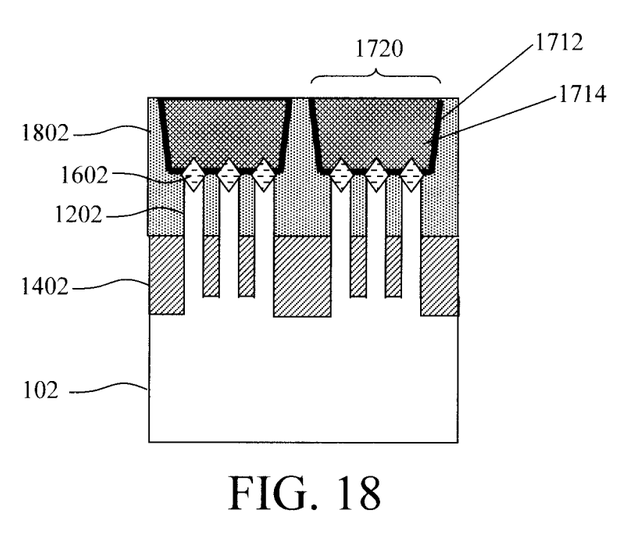
FIG. 18 is a cross-sectional diagram illustrating contacts having been formed to the source and drains according to an embodiment of the present invention.

1502 (see FIG. 16). FIG. 18 provides a 'cross-fin' cross-sectional view taken as a cut through one of the source and drains 1602 perpendicular to the fins 1202 (see FIG. 16).

To enable selective removal of the dummy gates 1502 and 1504, the dummy gates 1502 and 1504 are first buried in an insulator such as $SiO_2$ (see insulator 1802 in FIG. 18—described below). The dummy gates 1502 and 1504 are then removed selective to the insulator 1802 and, as shown in FIG. 17 (cross-fin cut), are replaced with replacement gates 1702.

As shown in magnified view 1704 the replacement gates 1702 each include an interfacial oxide 1706 on exposed surfaces of the fins 1202, a gate dielectric 1708 disposed over the interfacial oxide 1706, and a gate conductor 1710 disposed on the gate dielectric. Interfacial oxide 1706 can be formed by an oxidation process. According to an exemplary embodiment, interfacial oxide 1706 is formed having a thickness of from about 0.3 nm to about 5 nm and ranges therebetween, e.g., about 1 nm.

Suitable gate dielectrics include, but are not limited to, silicon oxide (SiOx), silicon nitride (SiN), silicon oxynitride (SiOxNy), high-κ materials, or any combination thereof. The term "high-κ" as used herein refers to a material having a relative dielectric constant κ which is much higher than that of silicon dioxide (e.g., a dielectric constant κ is about 25 for hafnium oxide ($HfO_2$) rather than 3.9 for $SiO_2$). Suitable high-κ materials include, but are not limited to, metal oxides such as hafnium oxide ($HfO_2$), hafnium silicon oxide (HfSiOx), hafnium silicon oxynitride (HfSiOxNy), lanthanum oxide ($La_2O_3$), lanthanum aluminum oxide ($LaAlO_3$), zirconium oxide ($ZrO_2$), zirconium silicon oxide ($ZrSiO_4$), zirconium silicon oxynitride (ZrSiOxNy), tantalum oxide (TaOx), titanium oxide (TiOx), barium strontium titanium oxide ($BaO_6SrTi_2$), barium titanium oxide ($BaTiO_3$), strontium titanium oxide ($SrTiO_3$), yttrium oxide ($Y_2O_3$), aluminum oxide ($Al_2O_3$). lead scandium tantalum oxide ($Pb(Sc,Ta)O_3$), and/or lead zinc niobite (Pb(Zn,Nb)O). The high-κ can further include dopants such as lanthanum (La), aluminum (Al) and/or magnesium (Mg). The gate dielectric material can be formed by any suitable process or any suitable combination of multiple processes, including but not limited to, thermal oxidation, chemical oxidation, thermal nitridation, plasma oxidation, plasma nitridation, atomic layer deposition (ALD), chemical vapor deposition (CVD), etc. According to an exemplary embodiment, gate dielectric 1708 has a thickness of from about 1 nm to about 5 nm and ranges therebetween, although less thicknesses and greater thicknesses are also conceived.

Suitable gate conductors include, but are not limited to, doped polycrystalline or amorphous silicon (Si), germanium (Ge), silicon germanium (SiGe), a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide ($RuO_2$), cobalt silicide (CoSi), nickel silicide (NiSi)), transition metal aluminides (e.g. $Ti_3Al$, ZrAl), TaC, TaMgC, carbon nanotubes, conductive carbon, graphene, or any combinations thereof. The gate conductor can further include dopants that are incorporated during or after deposition. In some embodiments, the gate may further comprise a workfunction setting layer between the gate dielectric and gate conductor. The workfunction setting layer can be a workfunction metal. The workfunction metal can be any suitable material, including but not limited a nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof. In some embodiments, a conductive material or a combination of multiple conductive materials can serve as both gate conductor and workfunction metal. The gate conductor and workfunction metal can be formed by any suitable process or any suitable combination of multiple processes, including but not limited to, atomic layer deposition (ALD), chemical vapor deposition (CVD), physical vapor deposition (PVD), sputtering, plating, evaporation, ion beam deposition, electron beam deposition, laser assisted deposition, chemical solution deposition, etc.

It is notable that, when a gate-first process is employed, any of the gate dielectrics and gate conductors provided above may be used to form gates 1502 and 1504. However, as described in detail above, use of metal gates with high-κ gate dielectrics favors a gate-last approach.

As shown in FIG. 17, contacts 1720 are also formed to the source and drains 1602. To form contacts 1720, a liner 1712 is first deposited, followed by a contact metal 1714. Suitable liner materials include, but are not limited to, titanium (Ti) and/or titanium nitride (TiN). According to an exemplary embodiment, the liner 1712 is deposited using a conformal deposition process such as ALD, CVD or PVD to a thickness of from about 1 nm to about 5 nm and ranges therebetween. Suitable contact metals include any of the metal gate conductors provided above (e.g., W, Ti, Ta, Ru, Hf, Zr, Co, Ni, Cu, Al, Pt, Sn, Ag and/or Au) and, when a metal gate is being formed, the contact metal can be co-deposited along with the gate conductor 1710.

As shown in FIG. 18 (cross-gate cut), insulator 1802 is present at the tops of the fins 1202. As described above, insulator 1802 is employed in the dummy gate removal process. The contacts 1720 are formed (as described above) in the insulator 1802 to the source and drains 1602.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of patterning fins in a wafer, the method comprising the steps of:
   forming at least one mandrel on the wafer;
   forming alternating layers of a first dielectric and a second dielectric alongside the at least one mandrel;
   removing the at least one mandrel;
   removing either the first dielectric or the second dielectric; and
   patterning the fins in the wafer using whichever of the first dielectric or the second dielectric that remains as fin hardmasks.

2. The method of claim 1, further comprising the steps of:
   depositing the second dielectric selectively onto the first dielectric;
   depositing the first dielectric selectively onto the second dielectric; and
   repeating the depositing steps x times until a desired number of the fin hardmasks are formed.

3. The method of claim 2, further comprising the steps of:
forming spacers alongside the at least one mandrel; and
depositing, in a first iteration, the first dielectric onto the spacers.

4. The method of claim 2, further comprising the step of:
removing excess material from the first dielectric and the second dielectric deposited on top of the at least one mandrel.

5. The method of claim 2, wherein multiple mandrels are formed on the wafer, the method further comprising the steps of:
forming the alternating layers of the first dielectric and the second dielectric alongside each of the mandrels with trenches present between adjacent mandrels; and
extending the trenches into the wafer.

6. The method of claim 1, wherein the first dielectric comprises a nitride material selected from the group consisting of: silicon nitride (SiN), silicon oxycarbonitride (SiOCN), and combinations thereof.

7. The method of claim 1, wherein the second dielectric comprises an oxide material selected from the group consisting of: silicon dioxide ($SiO_2$), silicon oxycarbide (SiOC), and combinations thereof.

8. The method of claim 1, wherein the alternating layers of the first dielectric and the second dielectric each have a thickness of from about 5 nm to about 10 nm and ranges therebetween.

9. The method of claim 1, wherein the at least one mandrel comprises amorphous silicon.

10. The method of claim 1, further comprising the steps of:
forming a pad layer on the wafer;
forming a first etch stop layer on the pad layer;
forming a second etch stop layer on the first etch stop layer;
forming a mandrel layer on the second etch stop layer; and
patterning the mandrel layer into the at least one mandrel.

11. The method of claim 10, further comprising the step of:
extending the at least one mandrel into the second etch stop layer.

12. The method of claim 10, wherein the step of patterning the fins in the wafer further comprises the step of:
using whichever of the first dielectric or the second dielectric that remains as the fin hardmasks to pattern the fins through the pad layer, the first etch stop layer, and partway through the wafer.

13. A method of forming a fin field-effect transistor (finFET) device, the method comprising the steps of:
forming at least one mandrel on a wafer;
forming alternating layers of a first dielectric and a second dielectric alongside the at least one mandrel;
removing the at least one mandrel;
removing either the first dielectric or the second dielectric;
patterning fins in the wafer using whichever of the first dielectric or the second dielectric that remains as fin hardmasks;
forming gates over the fins; and
forming source and drains on opposite sides of the gates, offset from the gates by gate spacers.

14. The method of claim 13, further comprising the steps of:
depositing the second dielectric selectively onto the first dielectric;
depositing the first dielectric selectively onto the second dielectric; and
repeating the depositing steps x times until a desired number of the fin hardmasks are formed.

15. The method of claim 13, wherein the fins comprise at least a first group and a second group of the fins, and wherein a spacing Si between the fins in the first group and the fins in the second group is independent from a spacing S2 between the first group and the second group.

16. The method of claim 15, further comprising the step of:
varying a width W of the at least one mandrel to vary the spacing S2 between the first group and the second group independent of the spacing S1 between the fins in the first group and the fins in the second group.

17. The method of claim 13, further comprising the step of:
forming an N-well and a P-well in the wafer below the fins.

* * * * *